United States Patent
Fischer et al.

(10) Patent No.: US 6,920,074 B2
(45) Date of Patent: Jul. 19, 2005

(54) METHOD FOR READING A MEMORY CELL IN A SEMICONDUCTOR MEMORY, AND SEMICONDUCTOR MEMORY

(75) Inventors: Helmut Fischer, Oberhaching (DE); Kazimierz Szczypinski, München (DE)

(73) Assignee: Infineon Technologies AG, Munich (DE)

( * ) Notice: Subject to any disclaimer, the term of this patent is extended or adjusted under 35 U.S.C. 154(b) by 140 days.

(21) Appl. No.: 10/642,906

(22) Filed: Aug. 18, 2003

(65) Prior Publication Data

US 2004/0037129 A1 Feb. 26, 2004

Related U.S. Application Data

(63) Continuation of application No. PCT/DE02/00486, filed on Feb. 11, 2002.

(30) Foreign Application Priority Data

Feb. 16, 2001 (DE) .......................................... 101 07 314

(51) Int. Cl.[7] ................................................ G11C 7/00
(52) U.S. Cl. .................................. 365/203; 365/189.04
(58) Field of Search ................................ 365/203, 196, 365/207, 190, 189.04

(56) References Cited

U.S. PATENT DOCUMENTS

| | | |
|---|---|---|
| 4,475,178 A | 10/1984 | Kinoshita |
| 4,933,907 A | 6/1990 | Kumanoya et al. |
| 5,010,523 A | 4/1991 | Yamauchi |
| 6,016,279 A | 1/2000 | Chi |
| 6,049,492 A * | 4/2000 | Vogelsang et al. .......... 365/196 |
| 6,104,653 A * | 8/2000 | Proebsting ................... 365/203 |
| 6,169,701 B1 | 1/2001 | Eto et al. |
| 6,198,677 B1 * | 3/2001 | Hsu et al. .................... 365/203 |

FOREIGN PATENT DOCUMENTS

EP    0 717 415 A2    6/1996

* cited by examiner

*Primary Examiner*—Thong Q. Le
(74) *Attorney, Agent, or Firm*—Laurence A. Greenberg; Werner H. Stemer; Ralph E. Locher

(57) ABSTRACT

In a semiconductor memory, there is capacitive coupling between bit lines that largely run in parallel. Outer sections of the bit lines are connected via respective switches to a sense amplifier arranged between the switches. When a memory cell is being read, the capacitive interference by other bit lines that are not coupled to the memory cell being read is kept as low as possible before the start of amplification by the sense amplifier by turning on the switches in that bit line. During the amplification phase, the remote outer section of that bit line is disconnected using the appropriate switch. In one embodiment, the capacitance of the bit line that is not connected to the memory cell to be read is increased further by additionally activating a precharging circuit.

5 Claims, 3 Drawing Sheets

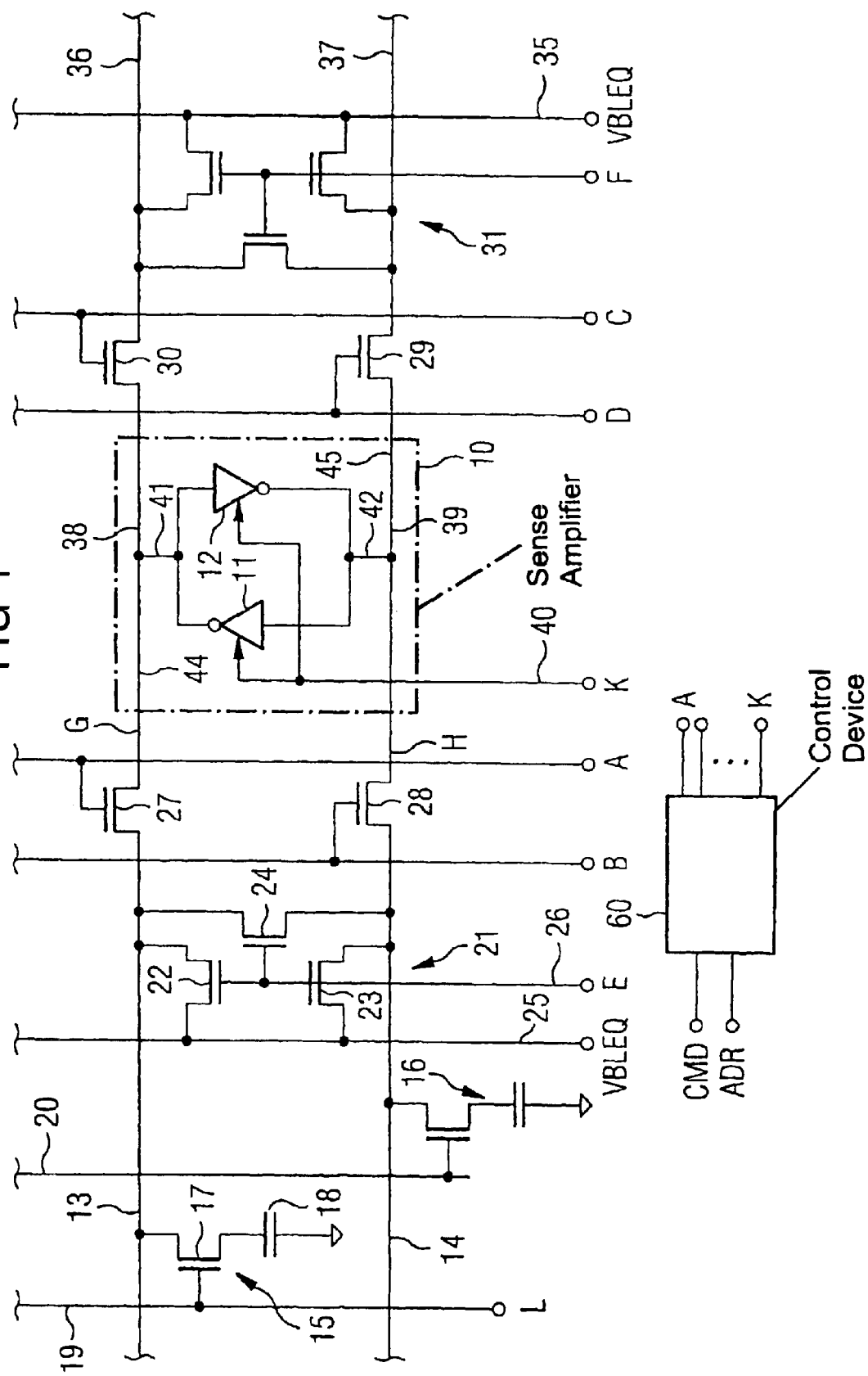

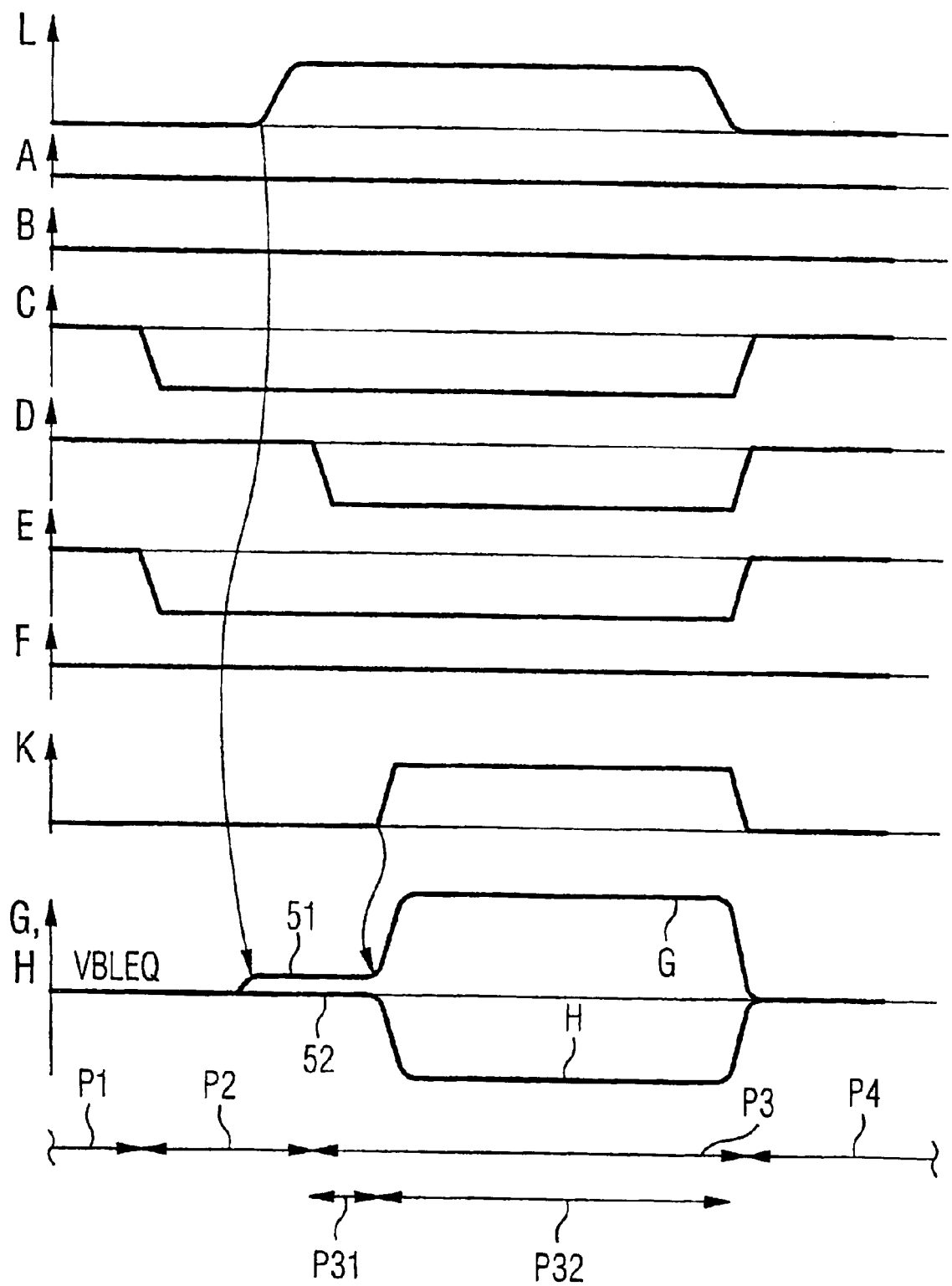

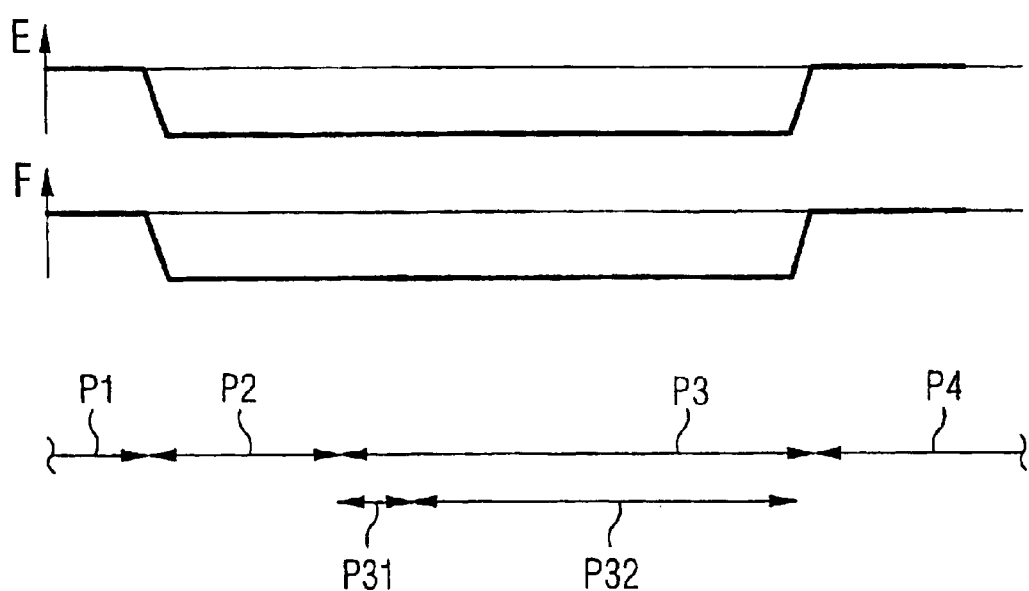

METHOD FOR READING A MEMORY CELL IN A SEMICONDUCTOR MEMORY, AND SEMICONDUCTOR MEMORY

CROSS-REFERENCE TO RELATED APPLICATION

This application is a continuation of copending International Application No. PCT/DE02/00486, filed Feb. 11, 2002, which designated the United States and was not published in English.

BACKGROUND OF THE INVENTION

Field of the Invention

In semiconductor memories, particularly in the case of DRAMs (Dynamic Random Access Memories), the memory cells in the memory cell array are connected to bit lines in order to transfer a data value which is to be read out or in. The regular structure of the memory cell array means that the bit lines run parallel to one another at least in sections. Activating a word line turns on an access transistor for the memory cell, and the charge state stored in a storage capacitor is applied to the bit line. The weak signal is amplified by a sense amplifier. The sense amplifier has initially been put into a balanced state and subsequently amplifies the asymmetry supplied to the bit line to give a signal of full level. The sense amplifier has complementary signal inputs. The bit lines connected to these signal inputs are referred to as uninverted bit lines and inverted or complementary bit lines. The memory cells connected to the uninverted bit line store the data value which is to be stored in uninverted form. The memory cells connected to the complementary bit line store the data value which is to be stored in inverted form.

Bit lines running next to one another are a problem. All of these bit lines run parallel to one another and are therefore capacitively coupled to one another. Both the bit lines connected to a sense amplifier and the bit lines directly or just indirectly adjacent to them which are connected to the adjacent sense amplifiers are routed parallel to one another. A critical factor is interference in the bit line in the bit line pair jointly connected to a sense amplifier which is not connected to the memory cell which is to be read. Since read operations are also taking place on the adjacent bit line pairs, the respective voltage changes are coupled into the latter bit line. As the structures become increasingly smaller, the capacitive coupling increases. Particularly when the storage capacitor is connected to the bit line by activating the word line, the capacitive coupling influences the readout operation on the currently active bit line. This means that the signal-to-noise ratio is reduced as the scale of integration increases, so that just small interference influences are enough to disturb the slight asymmetry between the two complementary bit lines. The sense amplifier could then build up to precisely the opposite signal.

As a remedy, sections of the complementary bit lines in some DRAMs are interchanged with one another. The capacitive coupling is then usually effective only in sections and can sometimes even be compensated for. Nevertheless, configurations of bits to be read can arise for which non-negligible coupling can arise between the complementary bit lines, since it is generally true that the coupling between bit lines with interchanged sections is approximately half the coupling for bit lines which have not been interchanged and run completely parallel.

As the scale of integration increases while the structure widths decrease, the coupling factor between the complementary bit lines can be reduced to less of an extent than the quantity of charge stored in the capacitor decreases. The influence of the capacitive coupling becomes relatively greater. Transferring previous designs to memories with an increasingly higher storage density therefore requires that they be modified.

SUMMARY OF THE INVENTION

It is accordingly an object of the invention to provide a semiconductor memory and a method for reading a memory cell in the semiconductor memory, which overcome the above-mentioned disadvantages of the prior art apparatus and methods of this general type.

In particular, it is an object of the invention to provide a method for reading a memory cell in a semiconductor memory which is less susceptible to interference.

Another object of the invention is to provide a semiconductor memory in which the read operation can take place with less susceptibility to interference.

With the foregoing and other objects in view there is provided, in accordance with the invention, a method for reading a memory cell in a semiconductor memory. The method includes: providing a first bit line having a first portion connected to a memory cell and a second portion; providing a second bit line having a first portion and a second portion, the first portion of the second bit line running opposite the first portion of the first bit line; providing a sense amplifier having a first connection and a second connection carrying a complementary signal with respect to the first connection of the sense amplifier; providing a first switch for connecting the first portion of the first bit line to the first connection of the sense amplifier; providing a second switch for connecting the first portion of the second bit line to the second connection of the sense amplifier; providing a third switch for connecting the second portion of the first bit line to the first connection of the sense amplifier; providing a fourth switch for connecting the second portion of the second bit line to the second connection of the sense amplifier; providing a first precharging circuit connected to the first portion of the first bit line and connected to the first portion of the second bit line; and providing a second precharging circuit connected to the second portion of the first bit line and connected to the second portion of the second bit line. In a first phase, the first switch, the second switch, the third switch, and the fourth switch are controlled to be conductive. In a subsequent second phase, the third switch is controlled to be blocked while the first switch, the second switch and the fourth switch are controlled to be conductive and the memory cell is coupled to the first portion of the first bit line for reading a stored data value. In a subsequent third phase, the third switch and the fourth switch are controlled to be blocked while the first switch and the second switch are controlled to be conductive and the sense amplifier is enabled for amplification. In a subsequent fourth phase, the first switch, the second switch, the third switch and the fourth switch are controlled to be conductive.

With the foregoing and other objects in view there is provided, in accordance with the invention, a semiconductor memory that includes: at least one memory cell; a first bit line having a first portion connected to the memory cell and a second portion; and a second bit line having a first portion and a second portion. The first portion of the second bit line runs opposite the first portion of the first bit line. The semiconductor memory also includes: a sense amplifier having a first connection for carrying a signal and a second connection for carrying a complementary signal with respect to the signal on the first connection of the sense amplifier; a first switch for connecting the first portion of the first bit line to the first connection of the sense amplifier; a second switch for connecting the first portion of the second bit line to the second connection of the sense amplifier; a third switch for connecting the second portion of the first bit line to the first connection of the sense amplifier; a fourth switch for connecting the second portion of the second bit line to the second connection of the sense amplifier; a first precharging circuit connected to the first portion of the first bit line and connected to the first portion of the second bit line; and a second precharging circuit connected to the second portion of the first bit line and connected to the second portion of the second bit line. The semiconductor memory also includes a control circuit for controlling the first switch, the second switch, the third switch, and fourth switch, the first precharging circuit, and the second precharging circuit such that: in a first phase, the first switch, the second switch, the third switch, and the fourth switch are conductive; in a subsequent second phase, the third switch is blocked while the first switch, the second switch and the fourth switch are conductive, and the memory cell is connected to the first portion of the first bit line for reading a data value stored in the memory cell; in a subsequent third phase, the third switch and the fourth switch are blocked while the first switch and the second switch are conductive and the sense amplifier is enabled for amplification; and in a subsequent fourth phase, the first switch, the second switch, the third switch and the fourth switch are conductive.

The method and the semiconductor memory are geared to complementary bit lines that are provided with respective outer bit line sections between which the connection nodes for the sense amplifier are situated. The respective outer bit line sections can be connected to the sense amplifier via switching transistors.

If a memory cell needs to be read on one of the bit lines, for example, the noninverting bit line on one side of the sense amplifier, then the section of the bit line that is situated on the opposite side of the sense amplifier is isolated by turning off the switch. The charge content of the storage capacitor for the memory cell that is to be read is then applied to the bit line via the corresponding word line by activating the access transistor. The switch connecting this section of the bit line to the sense amplifier is on. The inverted bit line running parallel to this uninverted bit line is likewise connected to the sense amplifier via its associated switch. It is fundamental that the other portion of this bit line that is situated on the other side of the sense amplifier is additionally likewise connected to the sense amplifier via the associated switch. The bit line section of the uninverted bit line that again runs parallel thereto is—as mentioned above—isolated from the sense amplifier by the appropriate switch.

The inverted bit line thus provides a parasitic capacitance that corresponds to the full length of the bit line. This includes the portion that is opposite the section of the uninverted bit line to which the memory cell is connected, and includes the portion that is on the other side of the sense amplifier. The small quantity of charge that is connected to the uninverted bit line, which is connected to the memory cell to be read, is now faced with a much higher capacitance. This results in a smaller voltage swing being coupled onto the complementary bit line as a result of parasitic capacitive coupling. If the sense amplifier's amplification phase is subsequently started, the portion of the complementary bit line which is remote from the memory cell to be read is disconnected in order to place an equal load on the sense amplifier on both bit lines. This restricts the current consumption in the sense amplifier to the very smallest degree necessary. The amplification speed is maintained.

Before the start of the sense amplifier's amplification phase, an additional capacitance is thus connected to the bit line that is not connected to the memory cell to be read. This capacitance is then disconnected again during the amplification operation, however. The dual capacitance of the passive bit line, which is opposite the active bit line connected to the memory cell to be read, halves the influence of the parasitic capacitive coupling of the bit lines of the other bit line pairs located directly and indirectly adjacent.

The bit lines are known to be connected to a precharging circuit before a read operation. This precharging circuit sets the bit line potentials to approximately the center voltage between the level values of the complementary logic states. Inverted and uninverted bit lines are shorted together in this context. The two bit lines are therefore at the same potential in the center of the level values for the logic states. On the side of the sense amplifier at which the memory cell to be read is connected, the precharging circuit is disconnected before the word line is activated. The two adjacent bit lines are then in a labile state that is deflected upon activation of the word line and the output of the quantity of charge contained in the memory cell that is to be read.

Advantageously, the precharging circuit, which is on the side of the sense amplifier that is opposite the memory cell to be read, remains activated. This first connects the complementary bit line, which is not connected to the memory cell to be read, to the precharging potential. In addition, the bit line section of the uninverted bit line that is isolated from the sense amplifier by the associated switch is connected to the complementary bit line via the precharging circuit. This measure first keeps all of the bit line sections that are not connected to the memory cell that will be read at the precharging potential, and second combines them into a larger parasitic capacitance than previously was the case. The interference from other bit lines on the inverted bit line is kept extremely low by this measure. During the sense amplifier's amplification phase, the section of the complementary bit line that is opposite the memory cell to be read for the sense amplifier is disconnected by the corresponding switch. This means that the associated precharging circuit is also disconnected from the sense amplifier. The precharging circuit can continue to remain active because the sections of the uninverted and complementary bit line that are coupled to it are isolated from the sense amplifier by switches that are respectively open.

For the invention, the readout operation on a sense amplifier is expediently split into four phases. During the first phase, all four bit line sections are connected to the sense amplifier by switches which are on. During a subsequent second phase, the bit line section of the bit line connected to the memory cell to be read and, which is remote from the memory cell to be read, is disconnected. During the subsequent third phase, the section associated with the opposite bit line is isolated from the sense amplifier, and the amplification operation is initiated. At the end of the amplification operation, all of the switches are turned on again and all four bit line sections of the uninverted and complementary bit line are connected to the sense amplifier.

The switches used are preferably n-channel MOS transistors whose controlled path is formed by the drain/source current path and whose control connection is formed by the gate electrode.

The precharging circuit includes a connection for the precharging potential situated in the center of the level for the complementary logic states. The drain/source paths of precharging transistors can be used to apply the precharging potential to opposite sections, running parallel, of the uninverted and complementary bit line. In addition, the precharging circuit includes a transistor that is connected between the adjacent bit lines. All of these transistors in the precharging circuit are actuated by the same control signal.

Other features which are considered as characteristic for the invention are set forth in the appended claims.

Although the invention is illustrated and described herein as embodied in a method for reading a memory cell in a semiconductor memory, and semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic diagram of a portion of a DRAM that is relevant to the invention;

FIG. 2 is a signal graph for a first embodiment; and

FIG. 3 is a signal graph for a second embodiment.

DESCRIPTION OF THE PREFERRED EMBODIMENTS

Referring now to the figures of the drawing in detail and first, particularly, to FIG. 1 thereof, there is shown a portion of a DRAM including a sense amplifier 10 having two complementary connections or inputs 41, 42. One of the inputs 41 has a first bit line 38 connected to it, and the other of the inputs 42 has a second bit line 39 connected to it. The bit lines 38, 39 run via the memory cell array in parallel orientation with respect to one another. The bit lines 38, 39 each have a multiplicity of memory cells connected to them. The memory cell 15 has, like all the memory cells, an access transistor 17 whose controlled path is connected first to the section 13 of the bit line 39 and second to a reference-ground potential via a storage capacitor 18. For the memory cells connected to the bit line 39, the memory cell 16 is shown by way of example. The data value stored in the memory cell 15 is stored in uninverted form. The bit line 38 is therefore referred to as an uninverted ("true") bit line. The data value stored in the memory cell 16 is stored in inverted form. The bit line 39 is therefore referred to as a complementary or inverted bit line. The gate connections on the selection transistors within the memory cells 15, 16 are connected to respective word lines 19, 20. To select the memory cell 15, for example, the word line 19 is actuated with a high potential in order to turn on the transistor 17. This connects the storage capacitor 18 to the bit line 38. Running parallel to the bit line pair 13, 14 shown in FIG. 1 are, in a regular corresponding arrangement, further bit line pairs which for their part are again connected to the sense amplifier. It can thus be assumed that further bit lines (not shown) run above and below the bit line pair 13, 14 shown.

The bit line 38 has a central section 44 which is connected directly to the connection or input 41 of the sense amplifier 10. Outer sections 13, 36 are situated on the right and left sides of the sense amplifier 10. The left section 13 is connected to the central section 44 via a switch 27, and the right section 36 is connected to the central section 44 via a switch 30. The switches are in the form of n-channel MOS transistors. Similarly, the complementary bit line 39 has a central section 45 which is connected to a left section 14 via a switch 28 and to a right section 37 via a switch 29. The switches 28, 29 are also n-channel MOS transistors. A precharging circuit 21 is connected between the left sections 13, 14 of the bit line pair. A connection 25 is used to apply an equalizing potential VBLEQ which is transferred to the respective bit line sections 13 and 14 via the controlled paths of n-channel MOS transistors 22, 23. In addition, the controlled path of an n-channel MOS transistor 24 is connected between the bit line sections 13, 14. All the transistors in the precharging circuit 21 are controlled jointly by their gates using a connection 26. A corresponding precharging circuit 31 is situated on the left side of the sense amplifier with an appropriate form.

For its part, the sense amplifier 10 contains two inverters 11, 12 whose input and output sides are connected to one another and which can be turned on and off via a connection 40. During the quiescent phase of the sense amplifier 10, the supply potential sides of the inverters 11, 12 are connected to the equalizing voltage VBLEQ. During the active amplification phase of the sense amplifier 10, the inverters 11, 12 are connected to the supply voltage, in each case by switches which can be actuated by the connection 40.

FIG. 2 shows the signal profiles of signals occurring in FIG. 1 during a read cycle. A read operation is signaled to the semiconductor memory by a corresponding read command. Corresponding row and column decoders activate the word line 19 and the bit line 38, for example, in order to read out the data value in the memory cell 15 arranged at their crossover point. Hence, the transistor 30 is first turned off by a low level for the control signal C supplied on its gate connection. This isolates the right section 36 from the central and left sections 44, 13 of the bit line 38. The transistor 27 remains on as a result of a high level for the control signal A applied to its gate connection. In the first phase P1, before a read command has been signaled to the memory, all the transistors 27, . . . , 30 are on. In the subsequent second phase P2, the transistor 30 is turned off and the word line 13 is activated by virtue of the word line signal L assuming a high level. This turns on the transistor 17. During this phase, only the transistor 30 is off. The other switching transistors 27, 28, 29 are on.

During the phase P2, the storage capacitor 18 is connected to the left section 13 of the bit line via the selection transistor 17, which is on. By way of example, the memory cell 18 stores a high level, so that the potential G of the bit line sections 13, 44 of the uninverted bit line 38 is easily raised. This rise is marked by 51 in FIG. 2.

The essentially parallel bit line sections 13, 14 and, in particular, the further bit lines (not shown) are capacitively coupled to one another parasitically. On all the bit line pairs, a comparable amplification operation takes place simultaneously. Only then is the data value to be read from the addressed memory cell selected. The potential changes on the adjacent bit lines therefore influence the bit line 39. Since the memory cell 15 to be read deflects the sense amplifier 10 only very slightly from the symmetry, there is the risk that the parasitic interference on the uninverted bit line 39 will disturb the signal which is to be read from the memory cell 15. In order to keep the coupling as a result of these parallel amplification operations as low as possible, the transistors 28, 29 are on, which means that the total capacitance is formed by the overall length of the bit line 39, including the left section 14, the central section 45 and the right section 37. This capacitance is larger than the capacitance formed by the sections 13, 44 of the bit line 38. This means that, despite the parasitic capacitive coupling between the bit lines 38, 39, the potential H on the bit line 39 is hardly altered. FIG. 2 identifies the signal profile by 52.

In a third phase P3 which now follows, the signal which is read out is amplified by the sense amplifier 10. In a first section P31, the transistor 29 is turned off by a low level from the signal D controlling it. Since the rise in potential 51 on the bit line 13 has already finished, the potential H on bit line 39 continues to remain constant. The sense amplifier is now turned on as a result of the activation of the signal K by virtue of its inverters 11, 12 being connected to the supply voltage. During the actual amplification phase P32, the slight potential difference between the bit lines 38, 39, whose central sections 44, 45 are connected to the inputs 41, 42 of the sense amplifier 10, is amplified. The potentials G, H on the bit lines 38, 39 are therefore amplified in mutually complementary signal levels. During the whole amplification phase P3, the transistor 29 is off, which means that the sense amplifier 10 need drive only the central and left sections 13, 44, 14, 45 of the bit lines 38, 39. The amplification operation takes place relatively quickly, and the current consumption by the inverters 11, 12 in the sense amplifier 10 is low.

The data value read from the memory cell 15 is now applied to the sense amplifier 10 with a sufficiently amplified signal level, which means that it can be tapped off via lines (not shown) and can be forwarded to the data output of the semiconductor memory.

At the start of the read operation, during the phase P1, the bit lines 38, 39 are precharged to a precharging potential. Precharging circuits 21, 31 required for this purpose are associated with the left and right bit line sections of the bit line pair. The left precharging circuit 21 is actuated by the control signal E, and the right precharging circuit 31 is actuated by the control signal F. During the phase P1, the precharging circuit 21 is activated. The precharging potential VBLEQ has a central level which is situated in-between a high level and a low level. The transistors 22, 23, which are on, are used to apply the level VBLEQ to the bit line sections 13, 14 during the phase P1. In addition, the transistor 24, which is on, is used for level equalization between the complementary bit line sections 13, 14. The right precharging circuit 31 has a corresponding function. At the end of the phase P1, the precharging circuit 21 is deactivated, which means that all of its transistors 22, 23, 24 are off. The memory cell 15 can then be read.

In the advantageous exemplary embodiment shown in FIG. 2, the precharging circuit 31 remains activated during the entire read operation. The capacitance to be attributed to the complementary bit line 39 during the phases P1, P2 then includes the capacitance components of the bit line sections 14, 45, 37, on account of the transistors 28, 29 which are on, and also includes the bit line section 36 on account of the activated precharging circuit 31. In this case—as outlined above—the bit line section 36 of the uninverted bit line 38 is isolated from the bit line sections 13, 44 associated with the memory cell 15 to be read by the open switch 30. The capacitance which is effective during the phase P2 on the side of the complementary bit line is therefore relatively high.

The signal profile in FIG. 3 differs from the embodiment in FIG. 2 in that the precharging circuit 31 is disconnected together with the precharging circuit 21 during the phase P2. The control signals E, F have the same signal profile. In this case, the two precharging circuits 21, 31 are deactivated during the phase P2, which means that the capacitance of the complementary bit line 39 is formed via the components 14, 45 and 37, but no longer by the right bit line section 36 of the uninverted bit line.

All of the transistors shown in FIG. 1 are n-channel MOS field-effect transistors. Their controlled paths are formed by the drain/source current paths. The transistors' conducting state is produced by appropriately impressing a signal on their gate connections.

The control signals shown in FIGS. 1 to 3 are provided by a corresponding control device 60, for example a state arithmetic unit. The input side of the control device 60 is supplied with commands CMD, for example reading, writing etc., and with addresses ADR for selecting particular memory cells. The state arithmetic unit's output side produces the control signals A, . . . , K in the time relationship shown in FIGS. 2 and 3.

We claim:

1. A method for reading a memory cell in a semiconductor memory, which comprises:

providing a first bit line having a first portion connected to a memory cell and a second portion;

providing a second bit line having a first portion and a second portion, the first portion of the second bit line running opposite the first portion of the first bit line;

providing a sense amplifier having a first connection and a second connection carrying a complementary signal with respect to the first connection of the sense amplifier;

providing a first switch for connecting the first portion of the first bit line to the first connection of the sense amplifier;

providing a second switch for connecting the first portion of the second bit line to the second connection of the sense amplifier;

providing a third switch for connecting the second portion of the first bit line to the first connection of the sense amplifier;

providing a fourth switch for connecting the second portion of the second bit line to the second connection of the sense amplifier;

providing a first precharging circuit connected to the first portion of the first bit line and connected to the first portion of the second bit line;

providing a second precharging circuit connected to the second portion of the first bit line and connected to the second portion of the second bit line;

in a first phase, controlling the first switch, the second switch, the third switch, and the fourth switch to be conductive;

in a subsequent second phase, controlling the third switch to be blocked while the first switch, the second switch and the fourth switch are conductive and the memory cell is coupled to the first portion of the first bit line for reading a stored data value;

in a subsequent third phase, controlling the third switch and the fourth switch to be blocked while the first switch and the second switch are conductive and the sense amplifier is enabled for amplification; and in a subsequent fourth phase, controlling the first switch, the second switch, the third switch and the fourth switch to be conductive.

2. The method according to claim 1, which further comprises controlling the first precharging circuit to be on during the first phase and controlling the first precharging circuit to be off during the second phase and the third phase.

3. The method according to claim 1, which further comprises controlling the second precharging circuit to be on during the first phase, the second phase, and the third phase.

4. The method according to claim 1, which further comprises controlling the second precharging circuit to be on during the first phase and controlling the second precharging circuit to be off during the second phase and the third phase.

5. A semiconductor memory, comprising:

at least one memory cell;

a first bit line having a first portion connected to said memory cell and a second portion;

a second bit line having a first portion and a second portion, said first portion of said second bit line running opposite said first portion of said first bit line;

a sense amplifier having a first connection for carrying a signal and a second connection for carrying a complementary signal with respect to said signal on said first connection of said sense amplifier;

a first switch for connecting said first portion of said first bit line to said first connection of said sense amplifier;

a second switch for connecting said first portion of said second bit line to said second connection of said sense amplifier;

a third switch for connecting said second portion of said first bit line to said first connection of said sense amplifier;

a fourth switch for connecting said second portion of said second bit line to said second connection of said sense amplifier;

a first precharging circuit connected to said first portion of said first bit line and connected to said first portion of said second bit line;

a second precharging circuit connected to said second portion of said first bit line and connected to said second portion of said second bit line; and a control circuit for controlling said first switch, said second switch, said third switch, and fourth switch, said first precharging circuit, and said second precharging circuit such that:

in a first phase, said first switch, said second switch, said third switch, and said fourth switch are conductive;

in a subsequent second phase, said third switch is blocked while said first switch, said second switch and said fourth switch are conductive, and said memory cell is connected to said first portion of said first bit line for reading a data value stored in said memory cell;

in a subsequent third phase, said third switch and said fourth switch are blocked while said first switch and said second switch are conductive and said sense amplifier is enabled for amplification; and in a subsequent fourth phase, said first switch, said second switch, said third switch and said fourth switch are conductive.

* * * * *